United States Patent
Miller et al.

(10) Patent No.: US 9,406,828 B2
(45) Date of Patent: *Aug. 2, 2016

(54) COMPACT PHOTOVOLTAIC GENERATION ASSEMBLY AND POWER SUPPLY

(71) Applicant: Solar Fiber Optics, LLC, Palm Beach Gardens, FL (US)

(72) Inventors: James E. Miller, West Palm Beach, FL (US); Stanley Mach, Riveria Beach, FL (US)

(73) Assignee: Solar Fiber Optics, LLC, Palm Beach Gardens, FL (US)

( * ) Notice: Subject to any disclaimer, the term of this patent is extended or adjusted under 35 U.S.C. 154(b) by 1 day.

This patent is subject to a terminal disclaimer.

(21) Appl. No.: 14/135,024

(22) Filed: Dec. 19, 2013

(65) Prior Publication Data

US 2014/0102538 A1  Apr. 17, 2014

Related U.S. Application Data

(63) Continuation of application No. 12/502,619, filed on Jul. 14, 2009, now Pat. No. 8,637,760, which is a continuation of application No. 11/684,294, filed on Mar. 9, 2007, now Pat. No. 7,582,826.

(51) Int. Cl.
*H01L 31/042* (2014.01)
*H02N 6/00* (2006.01)
*H01L 31/052* (2014.01)
*H01M 2/10* (2006.01)
*H01M 10/46* (2006.01)
*H01L 31/054* (2014.01)

(52) U.S. Cl.
CPC ........ *H01L 31/0522* (2013.01); *H01L 31/0543* (2014.12); *H01L 31/0547* (2014.12); *H01M 2/1072* (2013.01); *H01M 10/465* (2013.01); *Y02B 10/12* (2013.01); *Y02E 10/52* (2013.01)

(58) Field of Classification Search
CPC ....................................................... H01L 31/054
See application file for complete search history.

(56) References Cited

U.S. PATENT DOCUMENTS

| | | | | |
|---|---|---|---|---|
| 3,780,722 A * | 12/1973 | Swet | ............................. | 126/680 |
| 4,411,490 A | 10/1983 | Daniel | | |
| 4,751,622 A | 6/1988 | Williams | | |
| 4,830,677 A | 5/1989 | Geisler, Jr. et al. | | |
| 5,268,832 A | 12/1993 | Kandatsu | | |
| 5,343,330 A * | 8/1994 | Hoffman et al. | ............... | 359/708 |
| 5,575,860 A | 11/1996 | Cherney | | |
| 5,839,816 A | 11/1998 | Varga et al. | | |
| 6,396,239 B1 | 5/2002 | Benn et al. | | |
| 6,717,045 B2 * | 4/2004 | Chen | ............................. | 136/246 |
| 7,582,826 B2 | 9/2009 | Miller et al. | | |

OTHER PUBLICATIONS

Ciamberlini, C. et al, "Solar system for exploitation of the whole collected energy", Optics and Lasers in Engineering, vol. 39, pp. 233-246, (2003).
Anonymous, "Free Sun Power", Internet article retrieved Jul. 17, 2008, http://web.archive.org/web/20060218134024/http://freesunpower.com/inverters.php.

* cited by examiner

*Primary Examiner* — Eli Mekhlin
(74) *Attorney, Agent, or Firm* — McHale & Slavin, P.A.

(57) ABSTRACT

A compact photovoltaic generation assembly exhibiting improved photovoltaic efficiency and an extended operating life as compared to conventional photovoltaic systems is described. The assembly can also include a power supply for use at times when light energy is not readily available.

11 Claims, 8 Drawing Sheets

COMPACT PHOTOVOLTAIC GENERATION ASSEMBLY AND POWER SUPPLY

RELATED APPLICATIONS

In accordance with 37 C.F.R. 1.76, a claim of priority is included in an Application Data Sheet filed concurrently herewith. Accordingly, the present invention claims priority as a continuation of U.S. patent application Ser. No. 12/502,619, filed Jul. 14, 2009, entitled "COMPACT PHOTOVOLTAIC GENERATION ASSEMBLY AND POWER SUPPLY", now U.S. Pat. No. 8,637,760, issued Jan. 28, 2014, which is a continuation of U.S. patent application Ser. No. 11/684,294, filed Mar. 9, 2007, entitled, "COMPACT PHOTOVOLTAIC GENERATION ASSEMBLY AND POWER SUPPLY", now U.S. Pat. No. 7,582,826, issued Sep. 1, 2009, the entirety of which is incorporated herein by reference.

FIELD OF THE INVENTION

This invention relates generally to the field of solar energy conversion; particularly to devices for converting solar photons into an electric current, and most particularly to a compact photovoltaic generation assembly exhibiting improved photovoltaic efficiency and an extended operating life as compared to conventional photovoltaic systems.

BACKGROUND OF THE INVENTION

The cost of generating electricity has significantly increased over the past several years leading to a resurgence of interest in alternative methods for the generation of power, such as, the generation of electricity from sunlight.

Although solar power shows great promise as a source of electrical energy, the photovoltaic materials used to convert sunlight into electricity are expensive, fragile and inefficient in operation. Thus, utilization of such materials is wrought with difficulties and disadvantages.

First, conventional solar power generating devices are large and thus, occupy a great deal of space. The power generated by a photovoltaic system is proportional to the illumination thereon, and if large amounts of power are required, large collection areas are also required; i.e. a large photovoltaic system produces only a small amount of energy. As a result, photovoltaic systems are cumbersome, complicated and often have multiple parts, thus, necessitating difficult and expensive installation by trained professionals. Furthermore, a photovoltaic system is commonly installed on a roof or upper portion of a building to be supplied with power; as optimum operation is dependent on orientation to the sun. Many homes and buildings do not have the structure to maintain this orientation, thus, these systems exhibit only short periods of optimum operation. Accordingly, conventional solar power-generating systems are expensive, impractical and inefficient, and, therefore, not very popular.

Additionally, photovoltaic materials have a short operating life as they are highly susceptible to physical degradation. Continual exposure to heat, infrared radiation, ultraviolet radiation and destructive weather conditions all contribute to this degradation, furthering inefficiency of the system. Thus, frequent replacement of the materials is necessary, adding to the already high cost of a photovoltaic system.

If solar power is to become a standard means for the generation of electricity, it must be inexpensive, efficient and convenient to use. Thus, improvements to solar power generating systems that alleviate the above-described disadvantages are necessary.

DESCRIPTION OF PRIOR ART

People have been trying for years to mainstream solar power by improving efficiency and reducing expense of the photovoltaic system.

U.S. Pat. No. 6,396,239 B1, issued to Benn et al., on May 28, 2002, discloses a portable solar generator cart having flexible components that can be positioned to receive the most direct sunlight. This generator is small, easily installed and can eliminate the need for an expensive, roof-based photovoltaic system.

U.S. Pat. No. 4,830,677, issued to Herbert A. Geisler, Jr., on May 16, 1989, discloses a solar generator having a diamond-shaped enclosure and a spheroid solar cell array Internal to the enclosure. The diamond-shaped enclosure is constructed from light-transmissive panels and thus, does not protect the internal solar cell array from direct exposure to sunlight. The spherical array is disclosed as making the "most efficient use of space and available light such that there is a minimal power shortage in the event that a cloud passes over" (column 3, lines 32-35). The use of fiber optics is not disclosed.

U.S. Pat. No. 5,575,860, issued to Matthew Cherney on Nov. 19, 1996, discloses a fiber optic solar power-generating system. In this system, light is collected from an external tower and transmitted via optical fibers to internal photovoltaic plates. These photovoltaic plates are arranged in stacks to allow for high surface area. Since these stacks are contained within the structure (building to which the power is supplied), the photovoltaic plates are not exposed to weather or direct sunlight and therefore, can be inexpensively fabricated (see column 1, line 65 to column 2, lines 1-10 and column 2, lines 35-40).

The above-referenced patents disclose various aspects of known photovoltaic systems. However, these patents, whether singly or in combination, do not disclose the specific details of the invention as instantly described.

ABBREVIATIONS AND DEFINITIONS

The following list defines terms, phrases and abbreviations used throughout the instant specification. Although the terms, phrases and abbreviations are listed in the singular tense, the definitions are intended to encompass all grammatical forms.

As used herein, the term "AC current" refers to an alternating electrical current that flows in one direction, reverses and flows in the opposite direction. Household appliances generally run on AC current.

As used herein, the term "DC current" refers to a direct electrical current that flows in one direction only. Photovoltaic systems typically produce DC current.

As used herein, the term "voltage inverter" refers to an electrical device that converts DC current to AC current.

As used herein, the term "photovoltaic", abbreviated as "PV", refers to the direct conversion of light energy into electricity.

As used herein, the term "photovoltaic material" refers to any type of material capable of converting light energy into electricity.

As used herein, the term "photovoltaic generation assembly" refers to a complete set of components for converting light energy into electricity by the photovoltaic process. The term "photovoltaic system" is also used to refer to a photovoltaic generation assembly.

As used herein, the term "photovoltaic power supply" refers to a photovoltaic generation assembly that also includes a power supply for use when light energy is not readily available. The power supply is preferably, but is not limited to, an electrical storage means in the form of a rechargeable battery.

As used herein, the term "photovoltaic element" refers to an essentially planar assembly of solar cells or any photovoltaic material and ancillary parts, for example, but not limited to, interconnections, terminals and diodes, intended to generate DC power from light energy. The term "photovoltaic module" is also used to refer to a photovoltaic element.

As used herein, the term "photovoltaic array" refers to an interconnected system of photovoltaic elements that function as a single electricity-producing unit.

As used herein, the term "photovoltaic cell" refers to the smallest semiconductor unit within a photovoltaic element. The term "solar cell" is also used to refer to a photovoltaic cell.

As used herein, the term "photovoltaic efficiency" refers to the ratio of electric power produced by a cell at any instant to the power of the light energy striking the cell.

As used herein, the term "cold light" refers to light emitted from a substance that is not strongly heated, i.e. the light emission is not simply thermal radiation. The term "luminescence" is also used to refer to cold light.

As used herein, the term "fiber optic element" refers to any material that transmits and/or transfers light energy via fiber optics.

As used herein, the term "fiber optics" refers to the use of thin flexible transparent fibers to transmit light signals over distances. Light transmitted via fiber optics is cold light. The fibers used in fiber optics are preferably, but not limited to, glass fibers arranged in bundles.

As used herein, the term "light-energy collector" refers to any material that collects light energy to be transferred by fiber optic elements. Preferably, the light-energy collector is, but not limited to, a lens that collects and concentrates light energy to a small area.

As used herein, the term "solar tracking device" refers to a device that follows the path of the sun to maximize the solar radiation on the photovoltaic surface. Solar tracking devices are included in an embodiment of the invention.

As used herein, the term "fresnel lens" refers to a lens having concentric rings faced at slightly different angles such that light falling on any ring is focused to the same point. Placing a light source at the focal point of a fresnel lens gives rise to a strong beam of nearly parallel rays.

SUMMARY OF THE INVENTION

The instant invention generally provides a solar-powered generator that is inexpensive, efficient and convenient to use. The instant invention, in particular, provides a compact photovoltaic generation assembly exhibiting improved photovoltaic efficiency and an extended operating life as compared to conventional photovoltaic systems.

Both the individual components of the assembly and their arrangement contribute to its improved efficiency and extended operating life.

Photovoltaic materials operate best at low temperatures.

Continual exposure to elevated temperature decreases the power output of photovoltaic materials, i.e. decreases the voltage. In order to prevent a drop in voltage with its accompanying decrease in efficiency, the photovoltaic elements of the assembly are protected from direct light by a light-impervious housing.

Additionally, in this assembly, light is transferred to the photovoltaic material via fiber optic elements. Since no heat is transferred via fiber optics, the light transfer is cold. Thus, the photovoltaic materials are further protected from decreased efficiency due to heat damage.

Conventional solar panels are generally placed in a horizontal orientation, as on a roof, such that light reaches one surface. The components of the described assembly are arranged such that the photovoltaic materials are vertically placed within the light-impervious housing, thus surface area exposed to light is increased and the overall size of the assembly is decreased. Thus, a compact design is possible as the photovoltaic surface area does not require a large space and therefore the need for a complex and expensive roof-based photovoltaic system is eliminated.

The compact size itself gives the assembly several advantages, for example, portability. It can be easily delivered and installed without the added expense and complexities of conventional photovoltaic systems. Furthermore, the assembly does not become a permanent part of the building to which it is connected. It can be easily disconnected, transferred and quickly re-installed at a new location, i.e. if a homeowner is moving, he/she can move the assembly to the new home.

This invention provides many tangible benefits to the world community. It is inexpensive, efficiently-operating and conveniently-useable, thus encouraging utilization of solar power which, in turn, can lead to a decreased dependence on fossil fuels. It can save money by supplementing electricity purchased from a utility grid or it can replace the utility grid during electrical power outages and/or shortages. Furthermore, this assembly can provide power to developing areas of the world where electricity is not readily available.

It is an objective of the instant invention to provide a device for converting solar photon energy into an electric current.

It is an objective of the instant invention to provide a photovoltaic generation assembly exhibiting improved photovoltaic efficiency and an extended operating life.

It is another objective of the instant invention to provide a photovoltaic power supply exhibiting improved photovoltaic efficiency and an extended operating life for use at times when light energy is not readily available.

It is another objective of the instant invention to provide a photovoltaic generation assembly and power supply having a compact design.

It is yet another objective of the instant invention to provide a "roofless" photovoltaic system.

It is an objective of the instant invention to provide a portable photovoltaic generation assembly that can be quickly and easily delivered, installed, disconnected, transferred and re-installed at a new location.

It is an objective of the instant invention to provide a photovoltaic generation assembly and power supply that is inexpensive, efficiently-operating and conveniently-useable.

It is another objective of the instant invention to provide a photovoltaic generation assembly wherein the photovoltaic elements of the assembly are protected from direct light by a light-impervious housing thus extending the operating life of the photovoltaic elements.

It is yet another objective of the instant invention to provide a photovoltaic generation assembly wherein the components are arranged such that the photovoltaic materials are vertically placed within the light-impervious housing, thus surface area exposed to light is increased and the overall size of the assembly is decreased.

It is an objective of the instant invention to provide a photovoltaic generation assembly utilizing the cold light of fiber optics for transfer of light to further protect the photovoltaic materials from decreased efficiency due to heat damage.

It is another objective of the instant invention to provide a photovoltaic generation assembly and power supply that can be used to decrease dependency on fossil fuels.

It is yet another objective of the invention to provide a photovoltaic generation assembly and power supply that can save money by supplementing electricity purchased from a utility grid.

It is yet another objective of the invention to provide a photovoltaic generation assembly and power supply that can replace the utility grid during electrical power outages and/or shortages.

It is an objective of the instant invention to provide a photovoltaic generation assembly and power supply for use in areas of the world having limited access to electricity, such as developing nations.

It is another objective of the invention to provide a kit including components for assembling the photovoltaic generation assembly of the invention.

It is yet another objective of the invention to provide a kit including components for assembling the photovoltaic power supply of the invention.

All of the objectives and advantages of the instant invention are applicable to both the photovoltaic generation assembly and photovoltaic power supply.

Other objectives, features and advantages of this invention will become apparent from the following description taken in conjunction with the accompanying drawings wherein are set forth, by way of illustration and example, certain embodiments of this invention. The drawings constitute a part of this specification and include exemplary embodiments of the present invention and illustrate various objects and features thereof.

DETAILED DESCRIPTION OF THE INVENTION

For the purposes of promoting an understanding of the principles of the invention, reference will now be made to the embodiments illustrated in the drawings and specific language will be used to describe the same. However, the illustrated embodiments are merely exemplary. It is understood that no limitation of the scope of the invention is thereby intended. Any alterations and further modifications in the illustrated devices, and such further application of the principles of the invention as illustrated herein are contemplated as would normally occur to one skilled in the art to which the invention relates.

Figure 1:
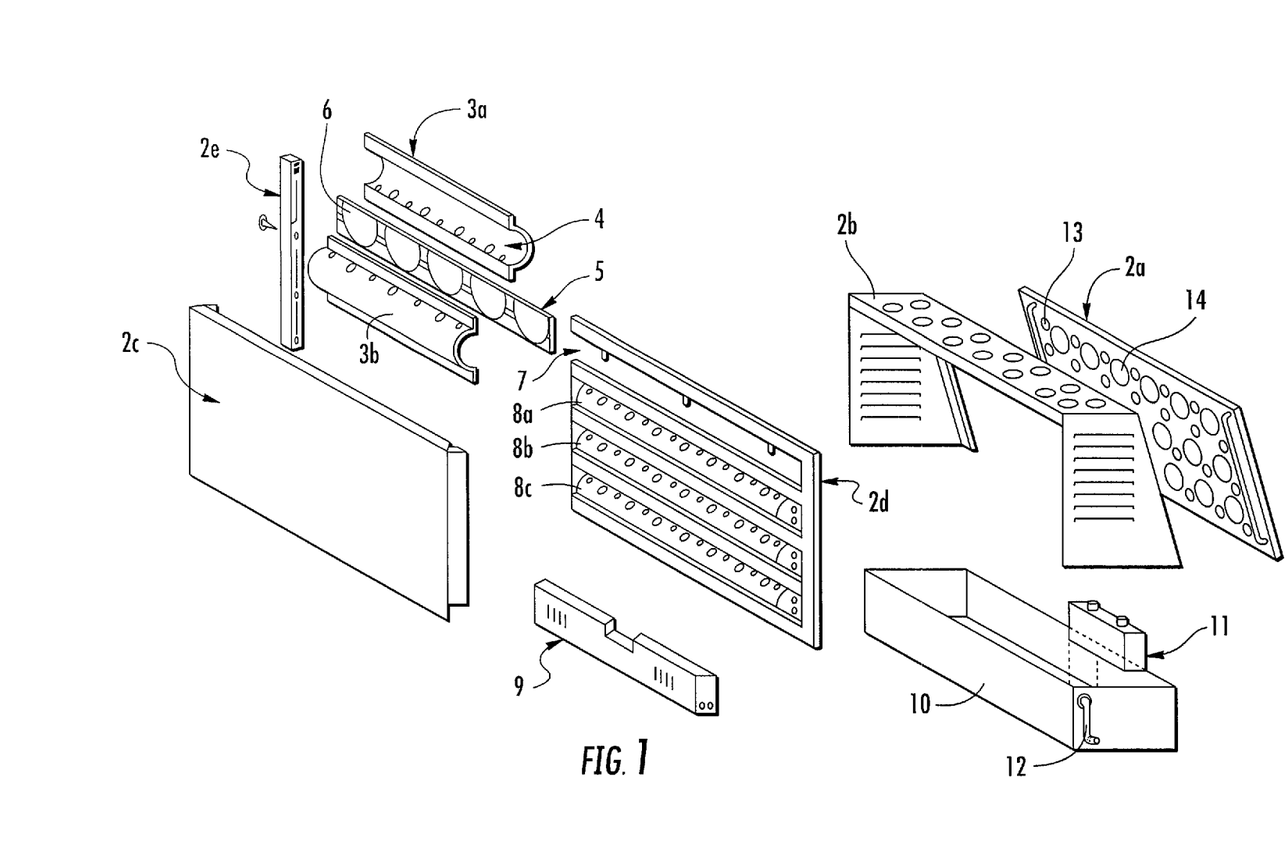
FIG. 1 is a schematic depiction of the assembly of a photovoltaic power supply according to the invention.

Referring now to FIGS. 1-8, which illustrate the photovoltaic generation assembly and power supply of the invention:

FIG. 1 is a schematic drawing demonstrating how individual components are pieced together to assemble a photovoltaic power supply according to a preferred embodiment of the invention. The individual components 1 are shown positioned for assembly into the photovoltaic power supply. First, the interior components are assembled. Insertable members 3a and 3b are engaged such that they enclose photovoltaic array 5. In this embodiment, insertable members 3a and 3b are hemispherically shaped such that when engaged photovoltaic array 5 is circularly enclosed. Although a hemispherical shape is a preferred embodiment, the shape of the insertable members is not limited thereto. Insertable members preferably have an internally-reflective surface 4. A non-limiting example of such an internally-reflective surface is a mirror. As enclosed by insertable members 3a and 3b, photovoltaic array 5 is slid into slot 7 of internal frame 2d of the light-impervious housing. Photovoltaic array 5 is shown having four photovoltaic elements 6, but is not limited to any specific number. Three photovoltaic arrays, 8a, 8b and 8c, are shown positioned in internal frame 2d. Internal frames may have any number of slots for positioning photovoltaic arrays. When all photovoltaic arrays have been positioned, frame cover 2e is engaged with the uncovered distal end of internal frame 2d and the frame is mounted on top of battery housing 10. The vertical position of internal frame 2d assures that multiple surfaces of photovoltaic elements 6 are exposed to light energy. A plurality of rechargeable batteries 11 can be stored in battery housing 10. These batteries store power to be utilized when light is not readily available, such as at night or on cloudy days. Next, the exterior components are assembled. The front panel 2a is engaged with the top/side panel 2b and the back panel 2c to form the light-impervious housing. Preferably, a plurality of light-energy collectors 13 and photovoltaic disks 14 are integral with front panel 2a and top/side panel 2b. The assembled light-impervious housing is then engaged with battery housing 10 to enclose frame 2d. Thus, the photovoltaic elements 6 are protected from direct exposure to light energy. The assembled photovoltaic power supply is then connected to the electrical system of the building to which it is to supply power through electrical control 12. Voltage inverter 9 is electrically connected to the system to convert the DC power produced by the assembly to more commonly utilized AC power.

The components of the photovoltaic generation assembly and power supply are suitable for packaging in a kit. Such a kit would include all the individual components necessary to assemble a complete photovoltaic generation assembly and power supply, a container for storing the components and written instructions explaining how to assemble the components into the completed product. A kit of this nature is commercially advantageous and can be used to conveniently transport and deliver all of the materials necessary to assemble and install the described photovoltaic generation assembly and power supply.

Figure 2:
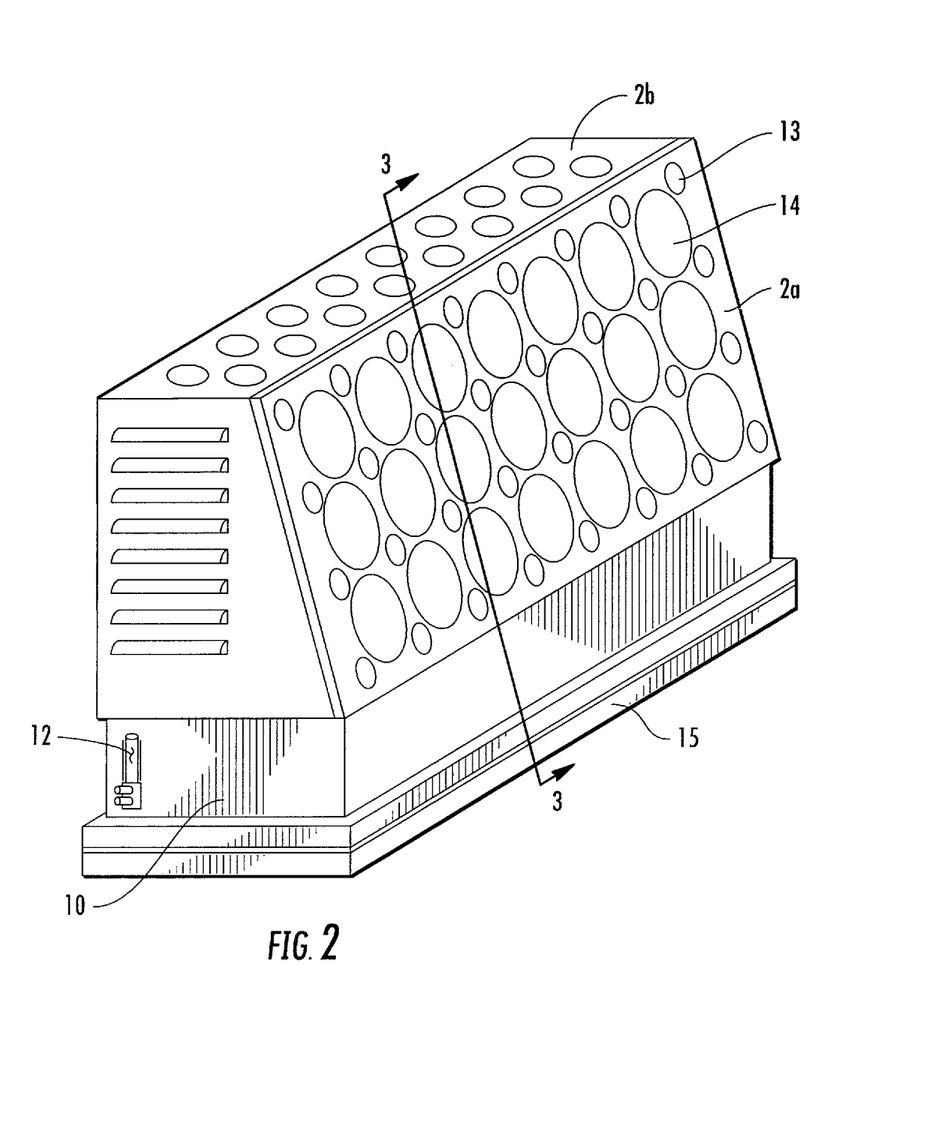
FIG. 2 is a perspective view of a photovoltaic power supply according to the invention.

FIG. 2 shows a perspective view of an assembled photovoltaic power supply ready for installation at a structure to which power is to be supplied, for example, but not limited to, a home or office building. Electrical control 12 is also designed to work with a solar tracking device(s) and/or flywheel generator 15. Solar tracking devices are contemplated for inclusion in a an embodiment of the invention.

Figure 3:
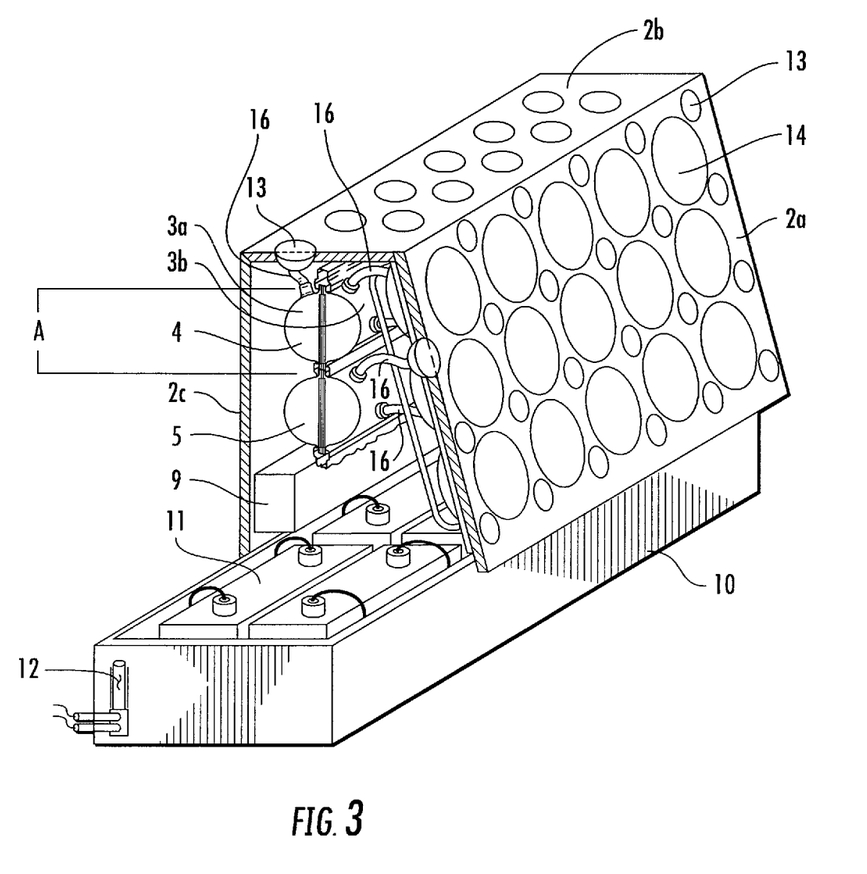
FIG. 3 is a cross-sectional view of a portion of the photovoltaic power supply of FIG. 2 taken along line 1-1.

FIG. 3 is a cross-sectional view of a portion of the photovoltaic power supply of FIG. 2 taken along line 1-1 in FIG. 2. This view shows fiber optic bundles 16. Fiber optic bundles 16 transfer light from light-energy collectors 13 to the interior through insertable members 3a and 3b to both sides of the photovoltaic array 5. When the cold light contacts the photovoltaic element, electrical energy is generated. The use of fiber optics keeps the light transfer cold, minimizing heat damage to the photovoltaic cells. The fiber optic element is preferably a fiber optic bundle comprising a plurality of glass or plastic fibers, but is not limited thereto.

Figures 4A, 4B:
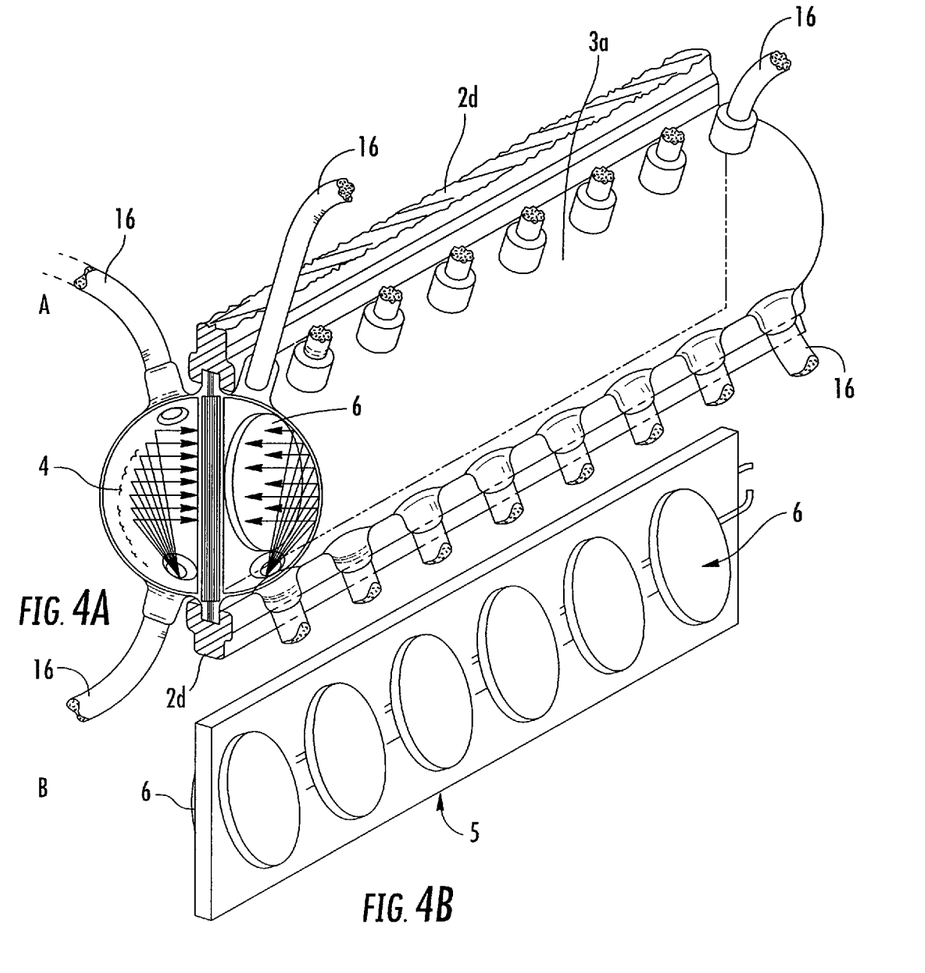
FIG. 4A is an exploded view of a portion of a photovoltaic power supply taken through the area indicated at A in FIG. 3.
FIG. 4B is an exploded view of a photovoltaic array according to one embodiment of the invention.

FIG. 4A is an exploded view of a portion of the photovoltaic power supply taken through the area indicated A in FIG. 3. When light enters the fiber optic bundle 16 only a portion is transferred directly to the photovoltaic element 6, since some of the light travels around the photovoltaic elements. The internal-reflective surface 4 of the insertable members prevents loss of light by reflecting and focusing light (that passes around the photovoltaic element) back to the photovoltaic surface. Preferably, internal reflective surface 4 is a mirror, but is not limited thereto. It is known that a reflective surface is selected according to the properties of the particular solar cells being used. One of skill in the art would know how to match a reflective surface and a solar cell for optimum efficiency. Although eight fiber optic bundles 16 are shown entering insertable member 3a, any number of fiber optic bundles is contemplated for use in the described invention.

FIG. 4B is an exploded view of a photovoltaic array 5 according to the invention. Although photovoltaic array 5 is shown having six photovoltaic elements 6, any number of photovoltaic elements 6 is contemplated for use in the described invention.

Figure 5:
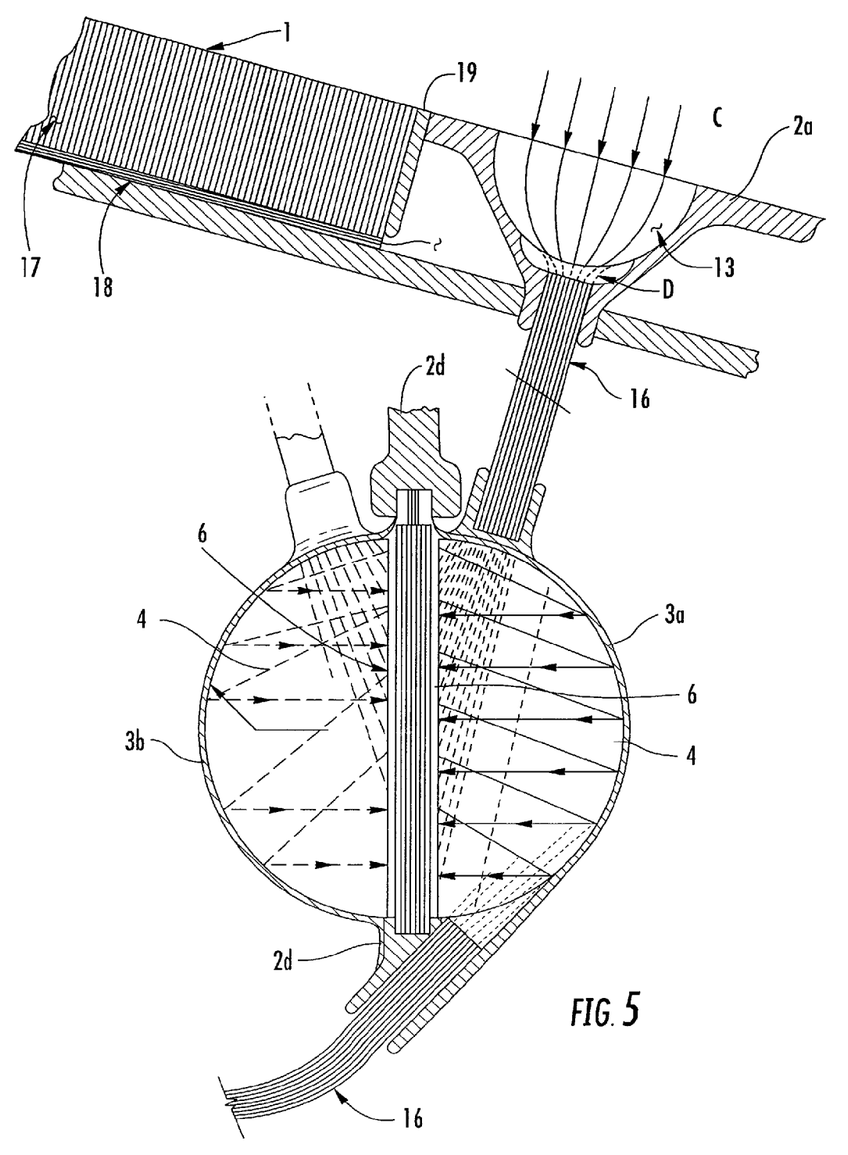
FIG. 5 is an exploded view of a portion of a photovoltaic power supply taken through the area indicated at B in FIG. 3.

FIG. 5 is an exploded view taken through the area indicated at B in FIG. 3. The detail of the assembly in operation is shown. Light enters light-energy collector 13 at area C, is focused at area D and transferred by fiber optic bundle 16 to the surface of photovoltaic element 6. Internal-reflective surface 4 of insertable members 3a and 3b reflect light back to the photovoltaic surface, minimizing loss of light through scatter and maximizing the amount of light absorbed by the photovoltaic element 6.

Additionally, FIG. 5 shows a photovoltaic disk 14 in cross-section. Photovoltaic disks are integral to the light-impervious housing at panels 2a and 2b. A photovoltaic disk 14, according to the invention, comprises a plurality of tightly-packed fiber optic elements 17 enclosed within a cramp ring 19 placed on the surface of photovoltaic element 18. The tightly-packed fiber optic elements 17 increase the quantity of light captured by preventing deflection of light. Cramp ring 19 functions to maintain the tightly-packed structure of the disk. The photovoltaic disk 14 increases the quantity of light captured since the tightly-packed fiber optic elements 17 prevent deflection of light.

Figure 6:
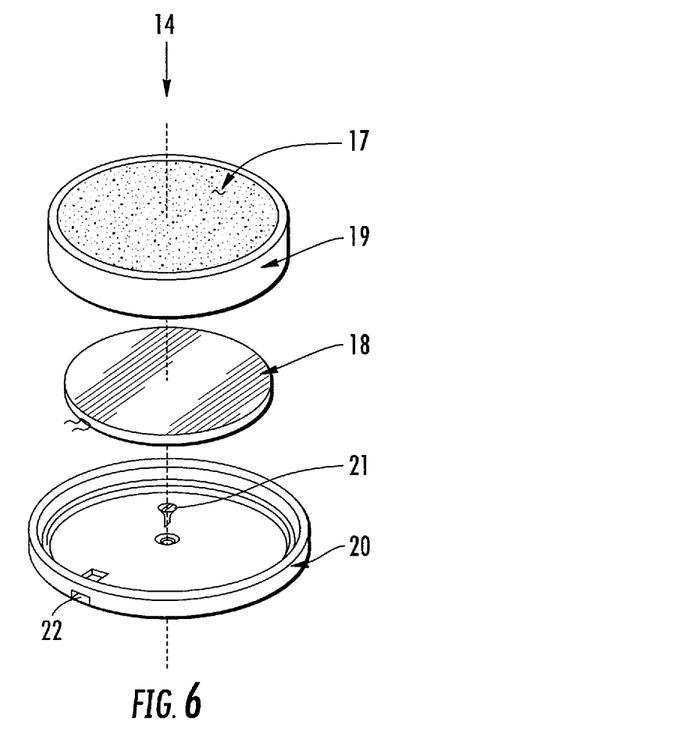
FIG. 6 is a schematic depiction of the assembly of a photovoltaic disk according to the invention.

FIG. 6 is a schematic depiction of the assembly of photovoltaic disk 14 according to the invention. The components of the disk are positioned for assembly. First, a plurality of tightly-packed fiber optic elements 17 enclosed within a cramp ring 19 are placed on the top surface of a photovoltaic element completely covering the surface and then both (fiber optic element and photovoltaic element) are enclosed within disk housing 20. The photovoltaic disk 14 can be integrated within light-impervious housing panels 2a or 2b using pin 21. Venting hole 22 in disk housing 20 cools the photovoltaic element 18 during operation. The tightly-packed fiber optic elements 17 protect photovoltaic element 18 against heat and light reflection.

Figure 7A:
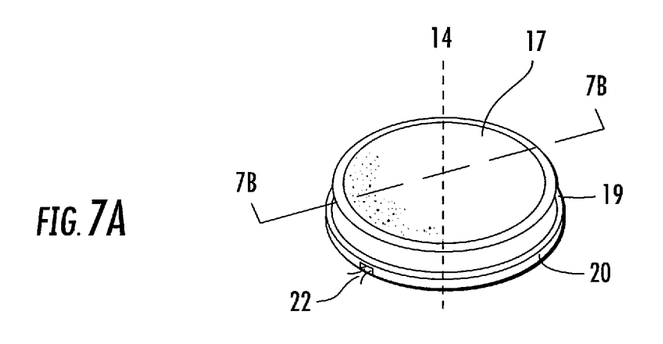
FIG. 7A is a perspective view of a photovoltaic disk according to the invention.
Figure 7B:
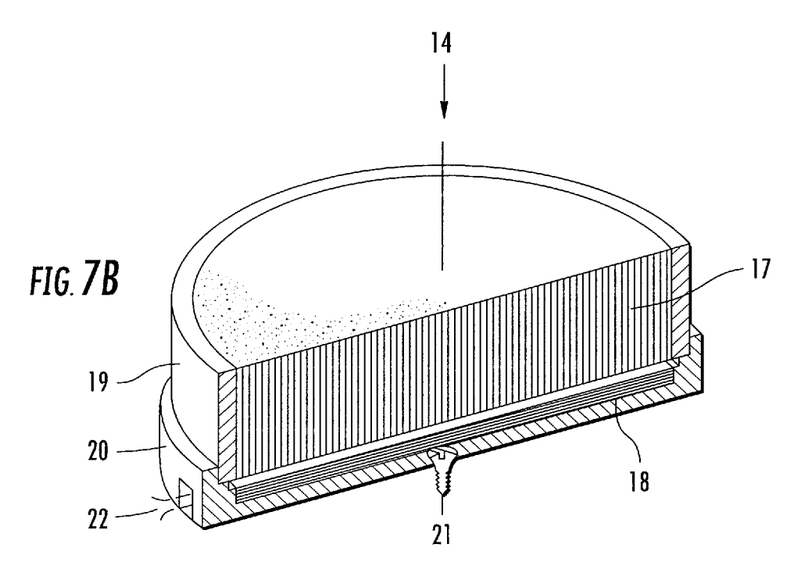
FIG. 7B is a cross-sectional view of a portion of the photovoltaic disk of FIG. 7A taken along line 2-2.

FIG. 7A is a perspective view of a fully assembled photovoltaic disk 14 according to the invention having universal multi-function solar cell application. FIG. 7B is a cross-sectional view of half of the photovoltaic disk 14 shown in FIG. 7A taken along line 2-2.

Figure 8:
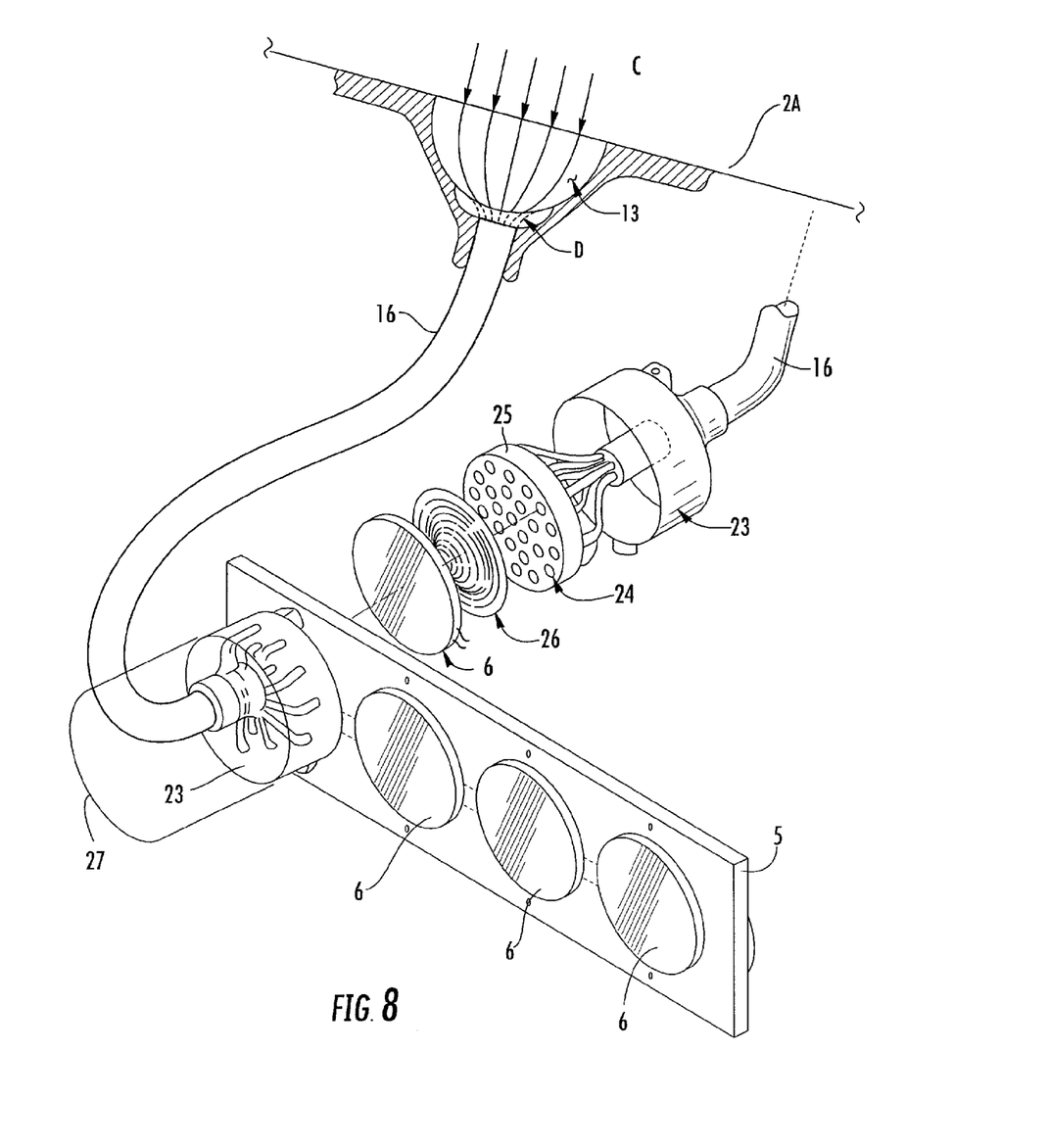
FIG. 8 is a schematic depiction of the assembly of a fiber optic-fresnel lens disk assembly according to the invention.

Another embodiment of light transfer via fiber optics is illustrated in FIG. 8. FIG. 8 is a schematic drawing of the assembly of a fiber optic-fresnel lens disk according to the invention. Light enters light-energy collector 13 at area C, is focused at area D and transferred by fiber optic bundle 16 akin to previously-described embodiments. However, in this embodiment, fiber optic bundle 16 is divided into a plurality of smaller fiber optic bundles 24, each integrated in a ring support 25. Fresnel lens 26 is placed such that it completely covers fiber optic bundles 24. Fresnel lens 26 directly focuses light transferred via fiber optic bundles 24 to the surface of photovoltaic element 6. Fresnel lens 26 and ring support 25 are enclosed within housing 23 which is engaged with photovoltaic array 5 such that the entire surface of photovoltaic element 6 is covered by fresnel lens 26. A photovoltaic power supply can include one or more fiber optic-fresnel lens disks 27.

In view of the description above, it will now be well understood that the present invention provides a compact photovoltaic generation assembly exhibiting improved photovoltaic efficiency and an extended operating life as compared to conventional photovoltaic systems which is inexpensive and convenient to use.

All patents and publications mentioned in this specification are indicative of the levels of those skilled in the art to which the invention pertains. All patents and publications are herein incorporated by reference to the same extent as if each individual publication was specifically and individually indicated to be incorporated by reference.

It is to be understood that while a certain form of the invention is illustrated, it is not to be limited to the specific form or arrangement herein described and shown. It will be apparent to those skilled in the art that various changes may be made without departing from the scope of the invention and the invention is not to be considered limited to what is shown and described in the specification and drawings/figures.

One skilled in the art will readily appreciate that the present invention is well adapted to carry out the objectives and obtain the ends and advantages mentioned, as well as those inherent therein. The photovoltaic generation assemblies, photovoltaic power supplies and kits described herein are presently representative of the preferred embodiments, are intended to be exemplary and are not intended as limitations on the scope. Changes therein and other uses will occur to those skilled in the art which are encompassed within the spirit of the invention and are defined by the scope of the appended claims. Although the invention has been described in connection with specific preferred embodiments, it should be understood that the invention as claimed should not be unduly limited to such specific embodiments. Indeed, various modifications of the described modes for carrying out the invention which are obvious to those skilled in the art are intended to be within the scope of the following claims.

What is claimed is:

1. A photovoltaic disc assembly comprising:
    a plurality of photovoltaic elements suitable for converting solar radiation into direct current electricity when subjected to sunlight, said photovoltaic elements having a side surface, a top surface and a rear surface;
    a disc housing assembly, said disc housing assembly including a plurality of cup shaped disc housings disposed within a panel, each disc housing having a base wall and a side wall, one said photovoltaic element of said plurality of photovoltaic elements positioned within a each disc housing adjacent said base wall, said sidewall extending substantially normal with respect to said base wall, said side wall including a step therein extending from a top surface of said disc housing toward said base wall, said step sized to position and retain a cramp ring positioned around a tightly packed arrangement of fiber optic elements said tightly packed arrangement of fiber optic elements having a predetermined length secured into said tightly packed arrangement of fiber optic elements, said tightly packed arrangement of fiber optic elements having a top surface, a bottom surface and a diameter, said bottom surface of said tightly packed arrangement of fiber optic elements positioned adjacent said top surface of said photovoltaic element, said diameter being sized to substantially cover said top surface of said photovoltaic element, said predetermined length being sufficient to transfer said solar radiation without transfer of heat associated with said sunlight.

2. The photovoltaic disc assembly of claim 1 wherein said predetermined length is less than said diameter.

3. The photovoltaic disc assembly of claim 1 wherein said step is positioned to maintain a gap between said bottom surface of said tightly packed arrangement and said front surface of said photovoltaic element.

4. The photovoltaic disc assembly of claim 3 wherein each disc housing with said photovoltaic element positioned therein includes a vent aperture through said sidewall, said aperture positioned to allow air to enter said gap between said tightly packed arrangement of fiber optic elements and said photovoltaic element.

5. A photovoltaic disc assembly comprising:
a panel;
a cup shaped disc housing having a base wall and a side wall disposed within said panel, said sidewall extending substantially normal with respect to said base wall, said disc housing sidewall including a step therein extending from a top surface of said disc housing toward said base wall, said step sized to position and retain a tightly packed arrangement of fiber optic elements;
a photovoltaic element suitable for converting solar radiation into direct current electricity when subjected to sunlight, said photovoltaic element having a side surface, a top surface and a rear surface, said photovoltaic element positioned substantially against an inner surface of said base wall;
a plurality of fiber optic elements having a predetermined length secured into a tightly packed arrangement, said tightly packed arrangement having a top surface, a bottom surface and a diameter, said bottom surface of said tightly packed arrangement positioned adjacent said top surface of said photovoltaic element, said diameter being sized to substantially cover said top surface of said photovoltaic element, said predetermined length being sufficient to transfer said solar radiation without transfer of heat associated with said sunlight.

6. The photovoltaic disc assembly of claim 5 wherein said tightly packed arrangement includes a cramp ring positioned thereabout, said cramp ring constructed and arranged to maintain said tightly packed arrangement.

7. The photovoltaic disc assembly of claim 6 wherein said disc housing includes a first cavity constructed and arranged to cooperate with said side surface and said rear surface of said photovoltaic element.

8. The photovoltaic disc assembly of claim 6 wherein said step is constructed and arranged to cooperate with said cramp ring positioned around said tightly packed arrangement.

9. The photovoltaic disc assembly of claim 5 wherein said disc housing includes a vent aperture through said sidewall, said aperture positioned to allow air to enter said gap between said tightly packed arrangement and said photovoltaic element.

10. The photovoltaic disc assembly of claim 5 wherein said step is positioned to maintain a gap between said bottom surface of said tightly packed arrangement and said front surface of said photovoltaic element.

11. The photovoltaic disc assembly of claim 10 wherein said predetermined length is less than said diameter.

\* \* \* \* \*